US006039581A

United States Patent [19]

DiMarco

[11] Patent Number: 6,039,581

[45] Date of Patent: Mar. 21, 2000

[54] ELECTRICAL CONNECTOR FOR CIRCUIT CARD ASSEMBLIES

[75] Inventor: Mario DiMarco, Scottsdale, Ariz.

[73] Assignee: Honeywell Inc., Minneapolis, Minn.

[21] Appl. No.: 09/000,773

[22] Filed: Dec. 30, 1997

[51] Int. Cl.[7] ................................ H01R 9/09; H05K 1/00

[52] U.S. Cl. ................................ 439/74; 439/923

[58] Field of Search ................................ 439/74, 75, 45, 439/160, 78, 152, 923

[56] References Cited

U.S. PATENT DOCUMENTS

| | | | |
|---|---|---|---|
| 4,708,660 | 11/1987 | Claeys et al. | 439/65 |
| 4,909,746 | 3/1990 | Scholz | 439/74 |
| 4,922,381 | 5/1990 | Longerich et al. | 361/414 |
| 4,929,185 | 5/1990 | Wong et al. | 439/74 |
| 4,998,887 | 3/1991 | Kaufman et al. | 439/78 |
| 5,051,366 | 9/1991 | Anderson et al. | 436/67 |
| 5,083,936 | 1/1992 | Yang | 439/441 |
| 5,269,692 | 12/1993 | Takahashi | 439/74 |
| 5,304,964 | 4/1994 | DiMarco | 333/181 |
| 5,655,914 | 8/1997 | McCartin | 439/78 |

*Primary Examiner*—Neil Abrams
*Assistant Examiner*—Hae Moon Hyeon

[57] ABSTRACT

A connector device provides an electrical connection between parallel mounted circuit card assemblies. On one circuit card assembly a male electrical connector is mounted which has electrical connection pins extending from it. On the other circuit card assembly is female electrical connector which has electrical connection holes which receive the connection pins. Mounted proximate to the male electrical connector is a connector guide which contacts at least two edges of the female electrical connector and guides the connector pins into the connector holes. The connector guide also extends above the connector pins and provides protection for the pins while the circuit card assembly is being handled.

8 Claims, 9 Drawing Sheets

ELECTRICAL CONNECTOR FOR CIRCUIT CARD ASSEMBLIES

FIELD OF THE INVENTION

The present invention relates to providing an electrical connection between multiple circuit cards and specifically to providing an orthogonal connection between circuit cards which are stacked in parallel.

BACKGROUND OF THE INVENTION

The use of circuit boards for memory logic and other circuitry is well known in the data processing field. The interconnection of multiple circuit boards is advantageous in the design of large scale computing systems, which includes avionics systems which are designed for aircraft. One of the design criteria for an avionics system is that the system take up as little room as possible. In most designs, the circuit boards are placed in boxes and positioned in a parallel fashion relative to the other cards. This design has the advantage that the layout of the circuit card assemblies takes up as little room as possible and the shortest electrical path between and within the circuit cards is attained.

In order to make electrical connections between circuit card assemblies, connector devices are mounted on each card. The connector device on one circuit card assembly has many pins which extend outwards while the other circuit card assembly which is to be connected to has many electrical connection holes which receive the pins. In most cases the pins and the holes are quite small so it is desirable that an alignment device is provided so that the proper electrical connections are made. When these multiple circuit card assemblies are installed on aircraft, there are very stringent requirements for flight applications which limit the selection of connectors available for use on both commercial and military aircraft. In a harsh environment such as an airplane, the connector must continuously provide electrical connection while enduring such environmental factors as vibration and large changes in temperature.

A desirable feature for an electrical connector is that proper alignment between the connector pins and the connection holes is provided during the manual connection of the circuit card assemblies. A device should be provided which guides the connector pins into the connector holes without causing damage.

FIG. 1 discloses a prior art solution for providing electrical connection between two parallel mounted circuit card assemblies. The male electrical connector 2 has a body which in most cases is formed out of plastic. Extending from the body are two flanges 4. Between the flanges are the electrical connector pins 6 which are electrically connected through the body of the connector to the circuit card assembly. Mounted on a second circuit card assembly is a female electrical connector 8 which has multiple electrical connection holes which receive the connection pins 6. The electrical connection holes 10 provide the electrical connection to the components on the circuit card assembly. The flanges 4 serve a two-fold purpose. The first purpose is to provide alignment between the two electrical connections during the connection process. The inside surfaces of the flanges are only wide enough to receive the female electrical connector 8. Once the body of connector 8 passes between the flanges, there will be no lateral movement between the two connectors and the pins can be inserted into their respective electrical connection holes.

The second purpose of the flanges 4 is to provide protection for the electrical pins 6 when the circuit card assembly is being inserted into the black box, laying on a table, or is otherwise being handled. These flanges are slightly taller than the electrical pins and allow the circuit card to be placed on a table or other surface so that the pins do not directly contact any other hard surfaces.

The disadvantage of this prior art design is that it is a custom made device and is relatively expensive to produce. Because the number of electrical connections can change from circuit card assembly to circuit card assembly, this device must be custom made to suit a particular purpose. This type of electrical connector is not an off-the-shelf type of item because there are too many changes in the requirements necessary in order to use this device.

It is desired to have an electrical connection device for circuit card assemblies which provides an electrical connection which endures the harsh environment of the aircraft operation. This new electrical connection device should include all the features of the prior art, but be relatively simple in design and inexpensive to produce.

SUMMARY OF THE INVENTION

Described herein is an apparatus which provides a compact orthogonal electrical connection between the circuit card assemblies which are mounted in parallel. In order to mount circuit cards in the most space efficient manner, they are mounted in parallel. Circuit cards which faces the surface of the circuit card assembly to which an electrical connection is desired. On one inward-facing surface is a male electrical connector that has protruding pins. Mounted on the inward facing surface of the other card is a female electrical connector which has a multitude of connection holes which would receive the pins from the male electrical connector. Also attached to the first circuit card assembly proximate to the male electrical connector is a guide which runs along at least three edges of the male electrical connector. This is constructed such that it is taller than any of the pins extending from the male electrical connector. This feature provides protection for the electrical pins when the circuit card is positioned on a hard surface or is otherwise handled. The guide is also manufactured such that its shape matches at least three external edge s of the female electrical connector. When the electrical connection is made between the two circuit card assemblies, the guide acts to position the male pins so that they are aligned with and properly seat in the electrical connection holes.

The male and female electrical connectors are very basic devices. The male electrical connector is simply a flat body with a series of electrical pins extending outward. The female connector is also a simple flat body with a series of electrical socket contacts which receive the electrical pins. The male and female connectors may be attached to the circuit card assemblies in a variety of different ways.

In one embodiment of the invention, the guide has a long thin body which extends along one entire edge of the male electrical connector and is formed such that it extends partially along two additional sides. The shape is such that it also follows the shape of the female electrical connector along one side and a portion of two additional sides. Extending from the body of the guide are at least two connector tabs which are used to attach the guide to the circuit card assembly. An additional tab is included which has a threaded hole. This hole is aligned with a hole in circuit card assembly when the guide is attached. This threaded hole provides for the insertion of a device or tool which allows the handler of the circuit card assemblies to separate them without causing any damage to the connectors.

In another embodiment of the invention, the body of the guide completely surrounds the male electrical connector with walls that are taller than the connector pins. The mounting surfaces are grounded to a chassis ground thereby configuring an electromagnetic interference (EMI) shield. This guide essentially creates a faraday cage around the assembled connectors. This feature minimizes noise, radiation, and susceptibility.

A guide is also disclosed which completely surrounds the electrical connectors in a manner similar to the previous embodiment. In this case the guide is attached to the circuit card assembly with through flanges which extend from the guide. The guide provides all the protection of the other embodiments except for the EMI insulation.

In the final embodiment of the invention, the guide is made up of two pieces. The guides are positioned at opposite ends of the male connector and cover the entire edge plus a portion of two additional edges. These guides also match the exterior shape of the female electrical connector so that the electrical pins are guided into these connecting holes. These guides are also taller than the pins extending from the male electrical connector and provide standoff protection for these pins while the circuit card assembly is handled.

DESCRIPTION OF THE PREFERRED EMBODIMENTS

Figure 3:
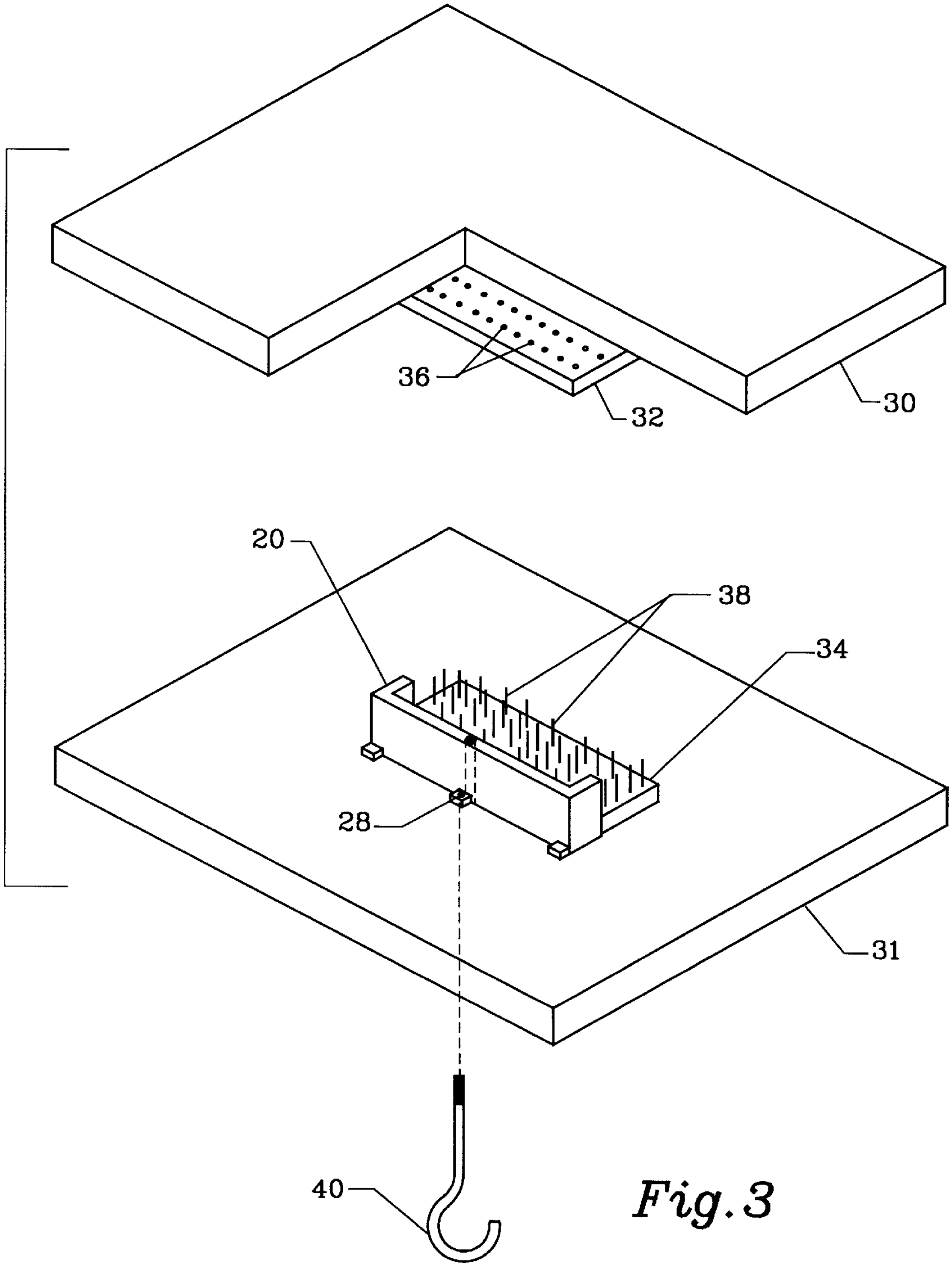
FIG. 3 shows an orthogonal view of the first embodiment of the electrical connector guide installed on the circuit card assemblies with the male and female electrical connectors.

Shown in FIG. 3 are two circuit card assemblies 30 and 31 which are to be connected. The circuit card assemblies 30 and 31 are of the type that you would find in any computing or data processing system which have multiple processor and other electrical components soldered thereto. In the embodiments described herein, the circuit card assemblies are mounted in some sort of box or other container in a parallel fashion. The circuit card assemblies are mounted quite close to each other such that rather than requiring an electrical harness of sorts to transmit electrical signals between the two circuit card assemblies, a plug type device can be used.

Mounted on circuit card assembly 31 is male electrical connector 34. In this preferred embodiment, this electrical connector is simply a rectangular piece made of plastic or other similar material with many electrical contacts protruding therefrom. These electrical connector pins 38 extend through the body of the connector and make electrical contact with contact points on the circuit card assembly. The attachment is made to the circuit card assembly with some sort of attachment means. This may be contacts which are soldered, or some other means to electrically connect the contacts to the circuit board.

Mounted on circuit card assembly 30 is female electrical connector 32. The body of this connector is similar to the body of the male electrical connector 34 in that it is a rectangular shaped body of a particular thickness made of plastic or another similar material. Instead of having contact pins extending from the body, contact holes are formed which allow the pins to pass through and contact conductive elements on the circuit card assembly 30. This female electrical connector is attached to the circuit card assembly 30 in a manner similar to the male electrical connector.

Figure 1:
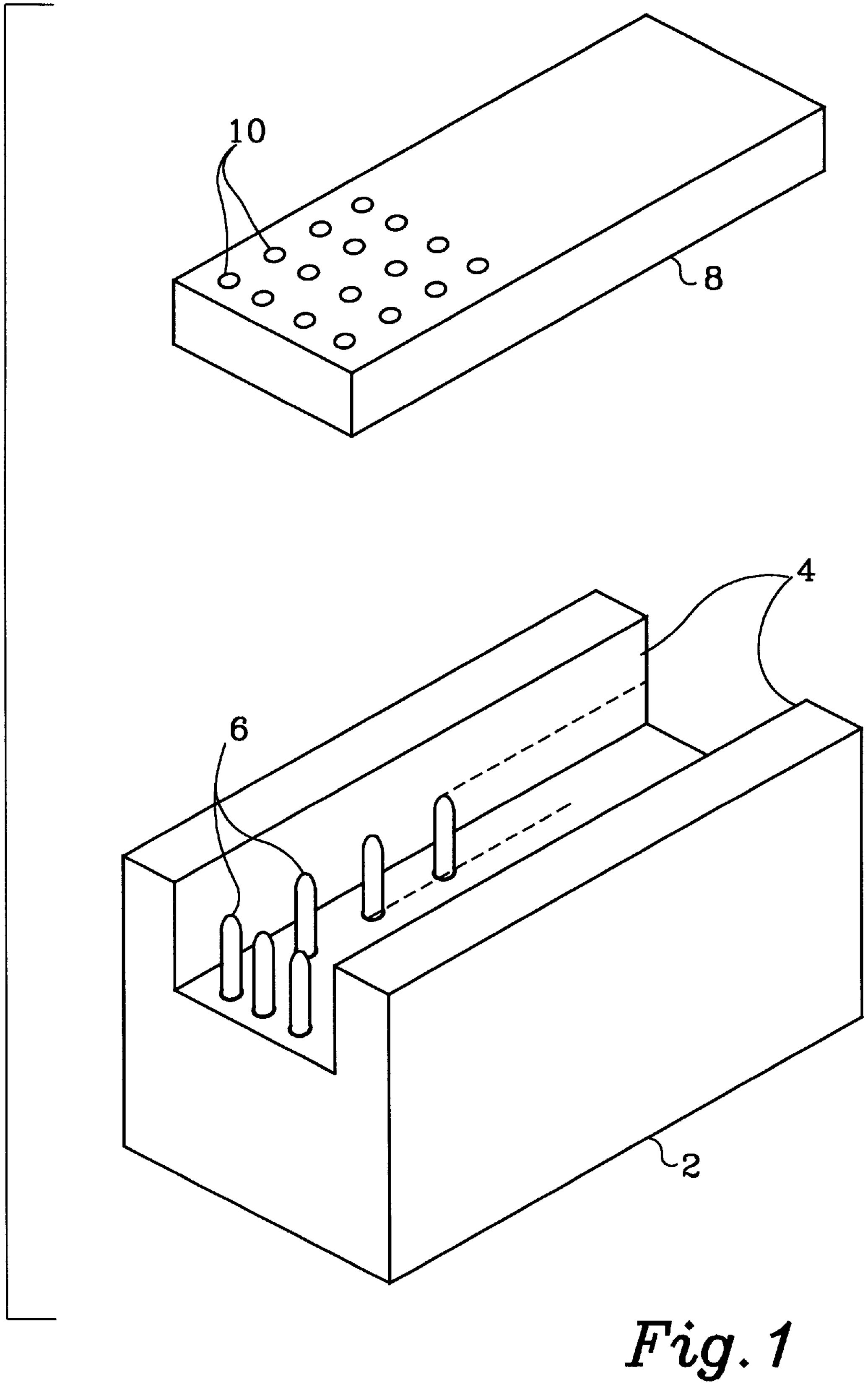
FIG. 1 discloses a prior art electrical connector for circuit card assemblies.
Figure 2A:
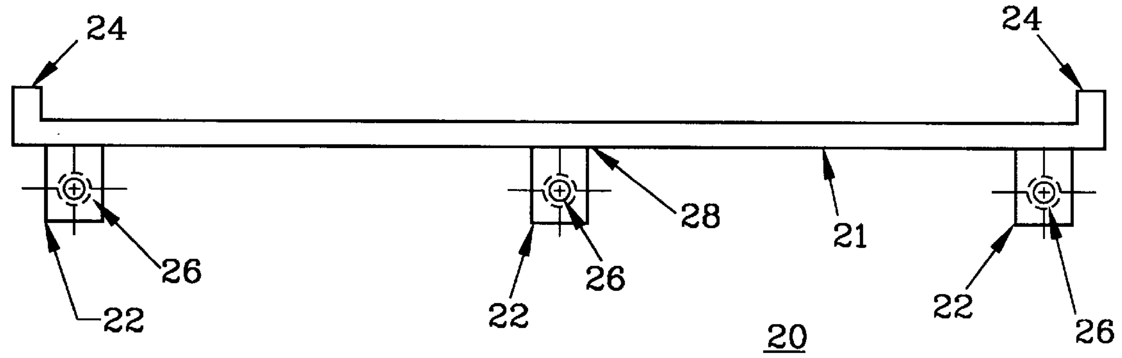
FIGS. 2*a* and 2*b* show top and side views of the first embodiment of the electrical connector guide.
Figure 2B:
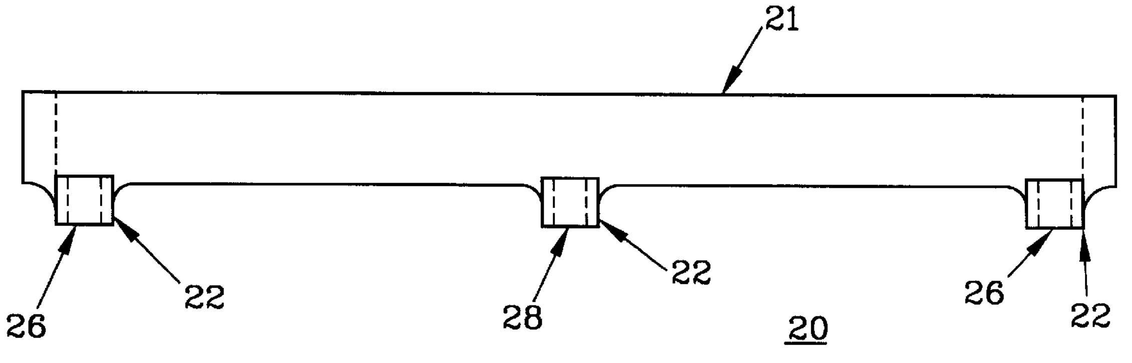

Also mounted on circuit card assembly 31, is connector guide 20. The features of this connector guide are shown in detail in FIGS. 2*a* and 2*b*. In the first embodiment of the invention, the connector guide is made up of a long rectangular body 21 with a length that is dependent on the size of the male and female connector. On either end of this rectangular body are flanges 24. Also extending from the body 21 are tabs 22. Holes 26 through the tabs are for mounting the connector guide to the circuit card assembly. The third tab has a threaded hole 28. When mounted on circuit card assembly 31, this hole is aligned with a hole through the circuit card itself. The rectangular shape of the connector guide is just one option. The connector guide may be circular, triangular or any other shape that may be necessary for a specific application.

Returning again to FIG. 3, the connector guide 20 is shown mounted on circuit card assembly 31. Two of the extending flanges are used to mount the guide on the circuit card assembly and the body of the guide runs along the longest edge of the male electrical connector 34 with the flanges extending up a portion of the shortest sides of the electrical connector. In this embodiment of the invention, the width of the body portion of the connector guide is taller than the connecting pins extending from the male electrical connector. This provides standoff protection for the pins, so that when the circuit card assembly is handled or set down on a hard flat surface, the connecting pins will not be damaged.

When circuit card assembly 30 and circuit card assembly 31 are manually connected, the connector guide 20 assists in aligning the male electrical connector 34 with the female electrical connector 32. In order to make this connection, the circuit card assemblies are first brought in close proximity to each other. At that point, the body of the connector guide 20 makes contact with female electrical connector 32. This contact is such that the body of the electrical connector contacts the long edge of female electrical connector 32 and the flanges which extend along the two shorter edges. At this point the electrical pins of the male electrical connector 34 are aligned with the electrical connection holes such that the two circuit card assemblies can be pressed together and an electrical connection made.

Also included in this embodiment of the invention is an apparatus for separating the two circuit card assemblies while minimizing the potential for damage. When the two cards are connected together, the separator device 40, which is a threaded rod, can be threaded into hole 28. As the separator device 40 is rotated, it threads upward through hole 28 and contacts circuit card assembly 30. As it extends further and further upward it contacts circuit card assembly 30. The pressure due to this upward motion causes the circuit card assemblies to separate. By using this type of device to separate the cards, the damage to any of the electrical connector pins is minimized.

Figure 4A:
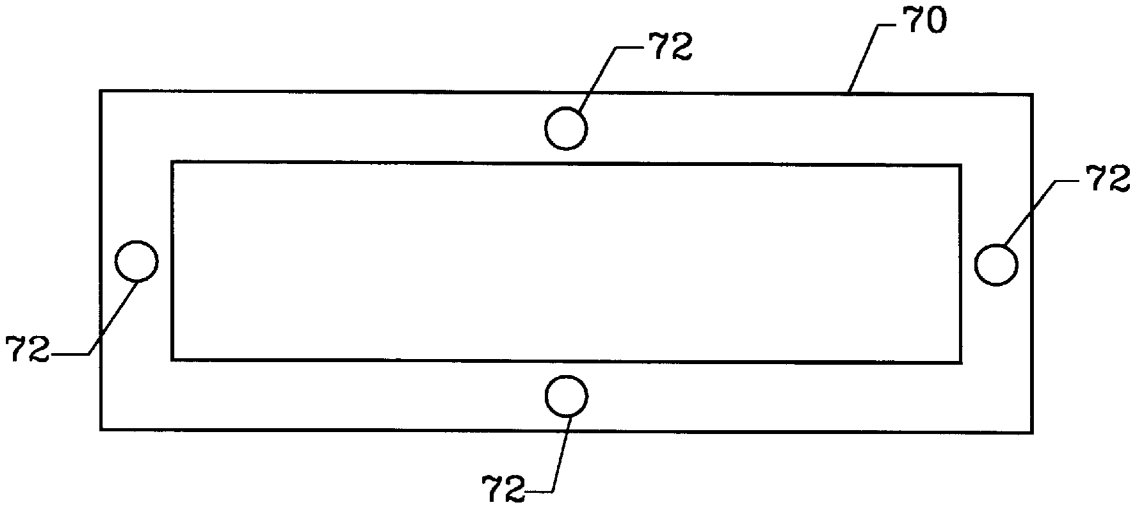
FIGS. 4*a* and 4*b* show top and side views of the second embodiment of the electrical connector guide.
Figure 4B:
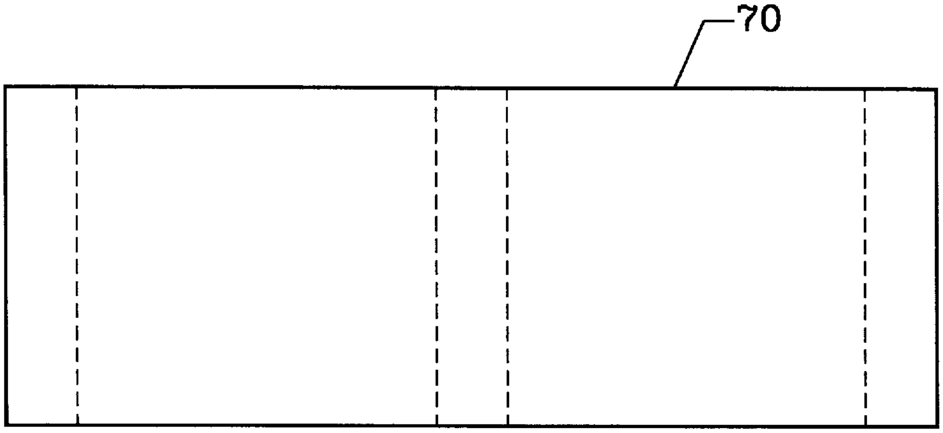
Figure 5:
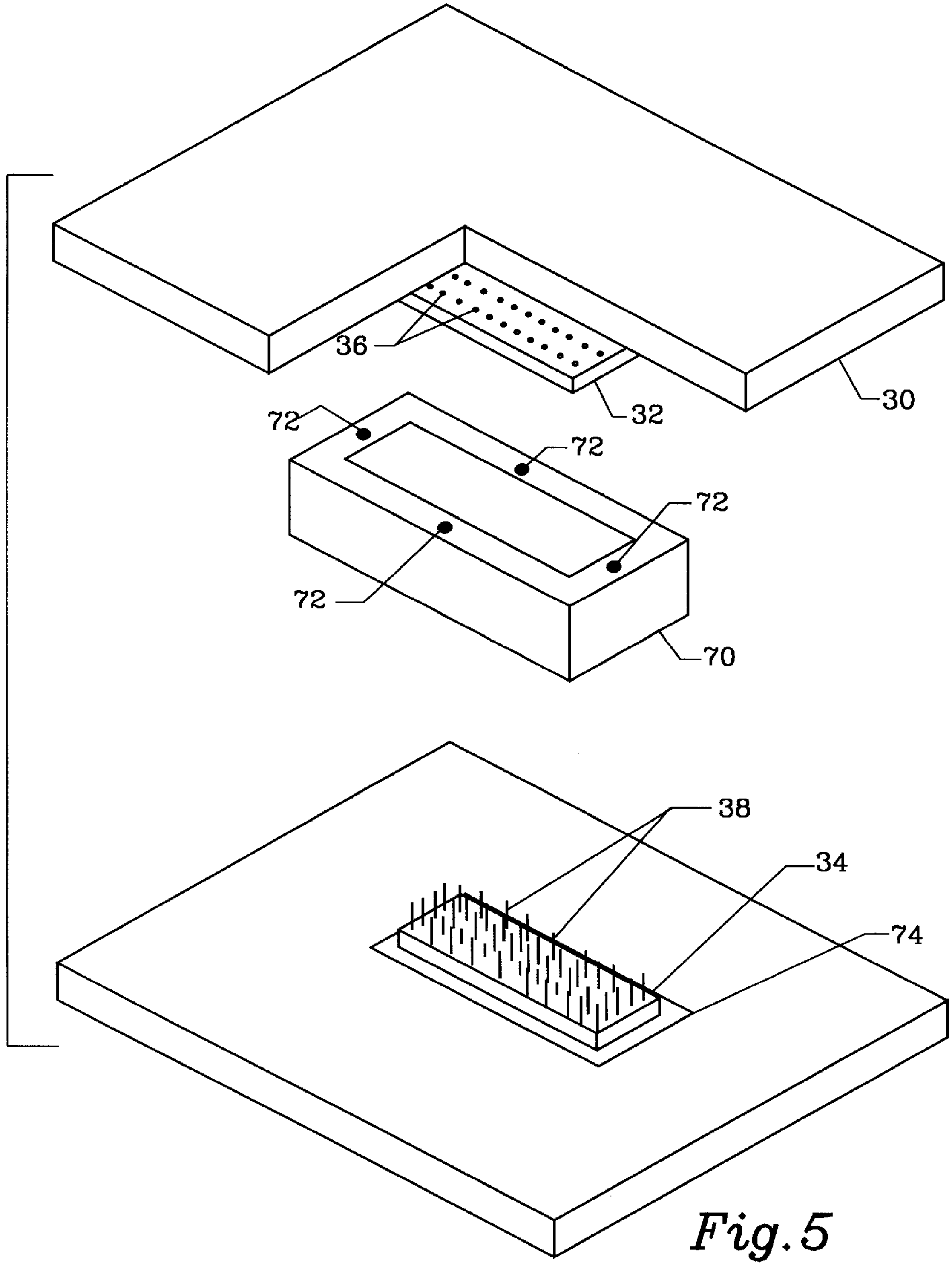
FIG. 5 shows an orthogonal view of the second embodiment of the electrical connector guide installed on the circuit card assemblies with the male and female electrical connectors.

The second embodiment of the invention is shown in detail in FIGS. 4*a* and 4*b* as well as FIG. 5. In this embodiment, the connector guide 70 is designed so that it completely surrounds the male electrical connector 34. As shown in FIGS. 4*a* and 4*b*, the connector guide has four connected walls which create an enclosed space within. Attachment to the circuit card assembly is made through the holes 72 which extend through the walls of the guide Shown in FIG. 5 is an exploded view of the connector guide with the circuit card assemblies. In order to establish the electrical connector between the two circuit card assemblies the same process is followed as with the first embodiment. The difference, in this case, is that all four walls of the connector guide contact the sides of the female electrical connector as well as the circuit card assembly. Once this connection is made, the female electrical connector slides within the guide and the pins can be pressed into the connector holes in order to establish the electrical contact. Surrounding the female electrical connector on the circuit card assembly is a solder strip 74. This strip contacts the walls of the connector guide when the electrical connection between the circuit card assemblies is made. In order to separate the circuit card assemblies, the separator device is threaded into one of the holes 72 which is not being used for attachment. As the device is rotated it threads further into the hole and contacts circuit card assembly 30, thus pushing the two cards apart.

One advantage of the second embodiment is that it provides standoff protection for the pins in all direction while the circuit board is being handled. Also the four walls which completely surround the connectors is electrically grounded to the chassis through solder strip 74. The guide creates a faraday cage around the connector between the interconnected circuit card assemblies. This feature minimizes noise radiation and susceptibility.

Figure 6A:
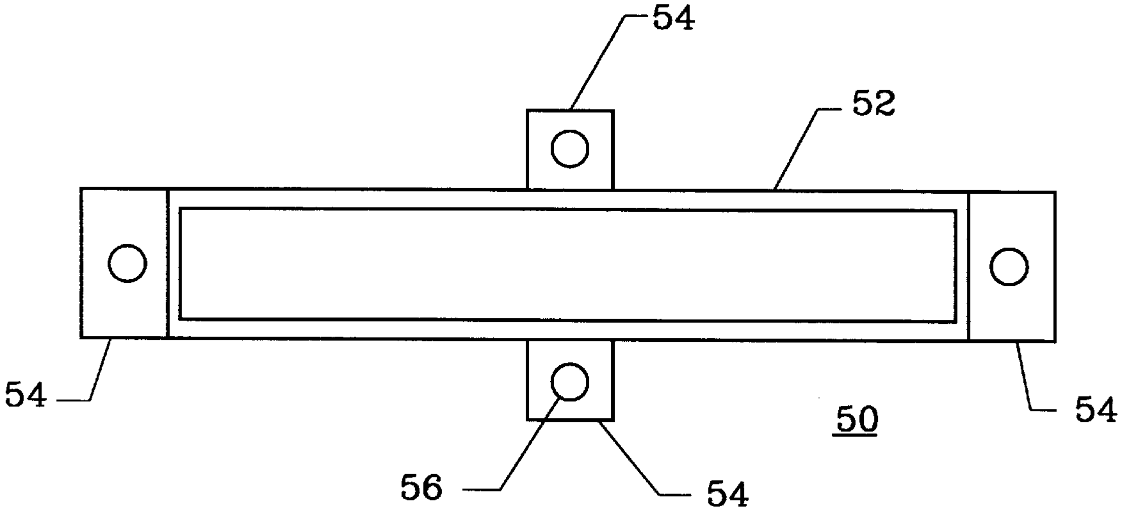
FIGS. 6*a* and 6*b* disclose top and side views of the third embodiment of the electrical connector guide.
Figure 6B:
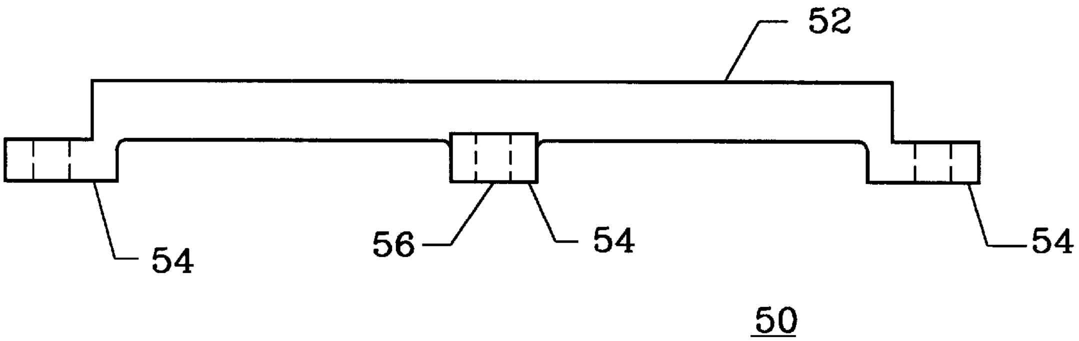
Figure 7:
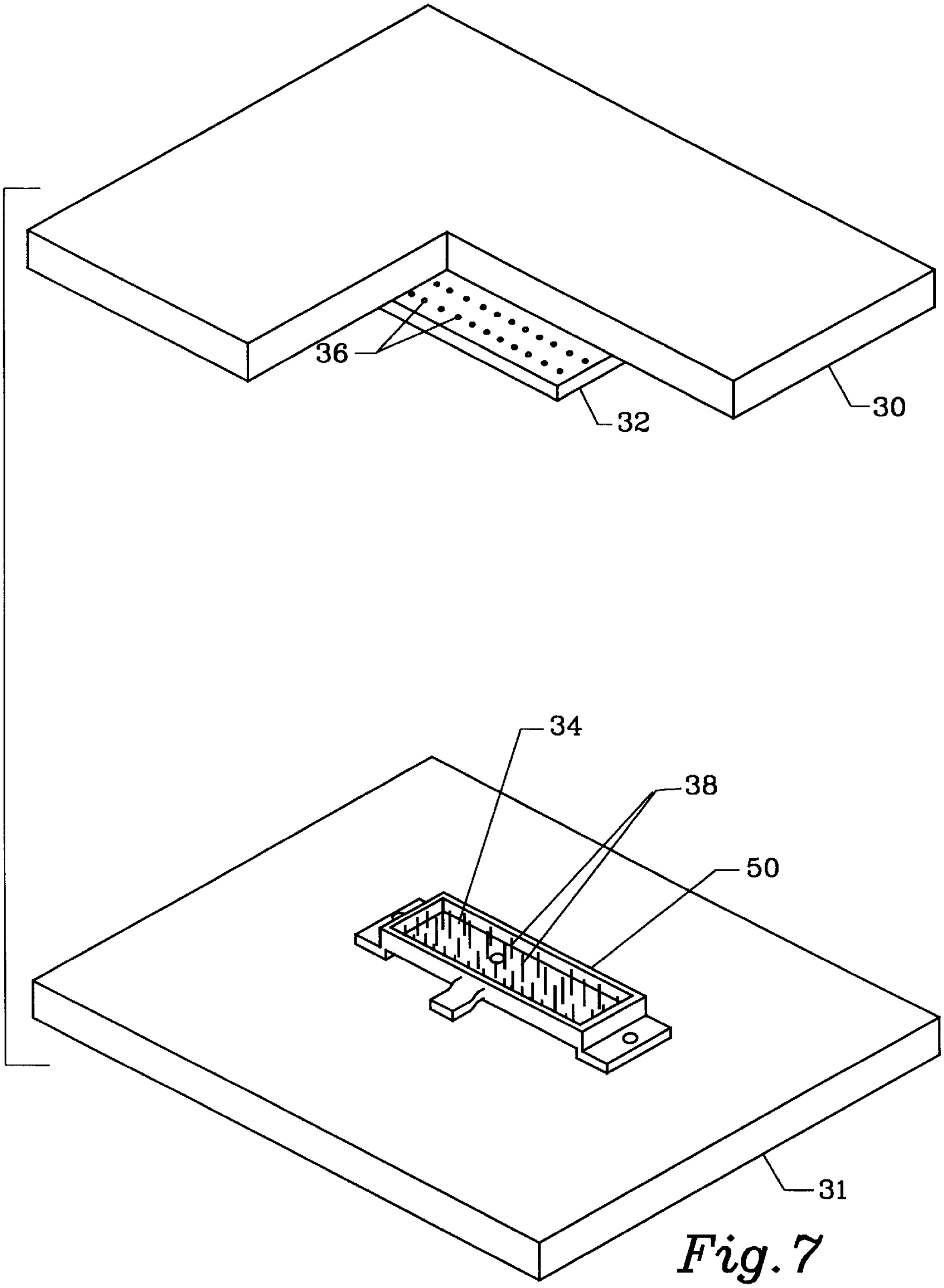
FIG. 7 shows an orthogonal view of the third embodiment of electrical connector guide installed on the circuit card assemblies with the male and female electrical connectors.

An embodiment which is similar to the embodiment just described is shown in FIGS. 6A, 6B, and 7. In this embodiment, the connector guide 52 is designed so that it completely surrounds the male electrical connector 34. Extending from the connector guide are tabs 54 which provide a mounting connection to the circuit card assembly. One of the tabs 54 has a threaded hole 56 formed in it which provides for the use of the circuit card assembly separator device 40.

Shown in FIG. 7 is an exploded view of the connector guide with the circuit card assemblies. In order to establish the electrical connection between the two circuit card assemblies, the same process is followed as with the first two embodiments. All four walls of the connector guide contact the sides of the female electrical connector. Once this connection is made, the female electrical connector slides within the guide and the pins can be pressed into the connector holes in order to establish the electrical contact. In order to separate the circuit card assemblies, the separator device is threaded into one of the hole 56 which is not being used for attachment. As the device is rotated it threads further into the hole and contacts circuit card assembly 30, thus pushing the two cards apart.

While this embodiment does not provide the EMI protection of the previous embodiment, it does provide everything else. The walls of the connector are tall enough to provide standoff protection for the electrical pins when the circuit card assembly is being handled. Also provided is an accurate guide for guiding the electrical pins into the connection holes.

Figure 8A:
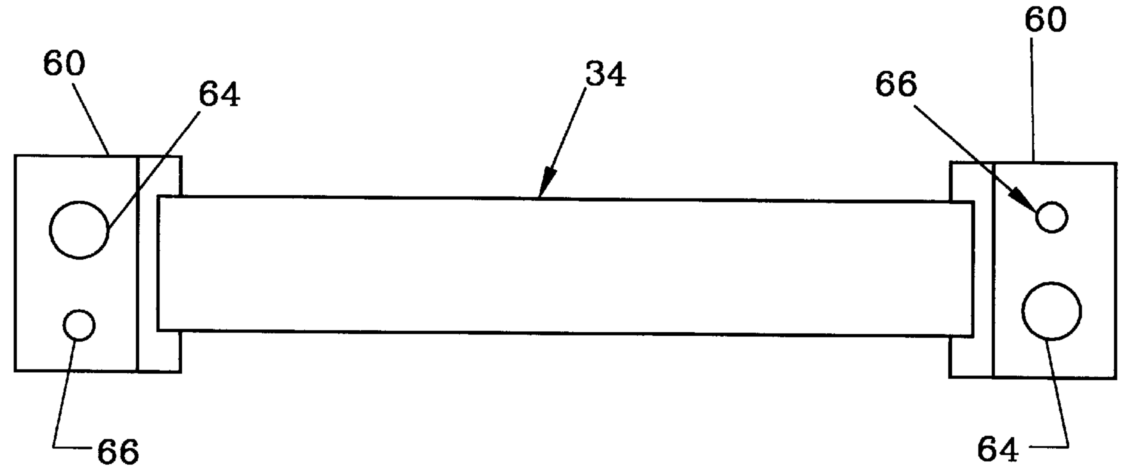
FIGS. 8*a* and 8*b* disclose top and side views of the fourth embodiment of the electrical connector guide.
Figure 8B:
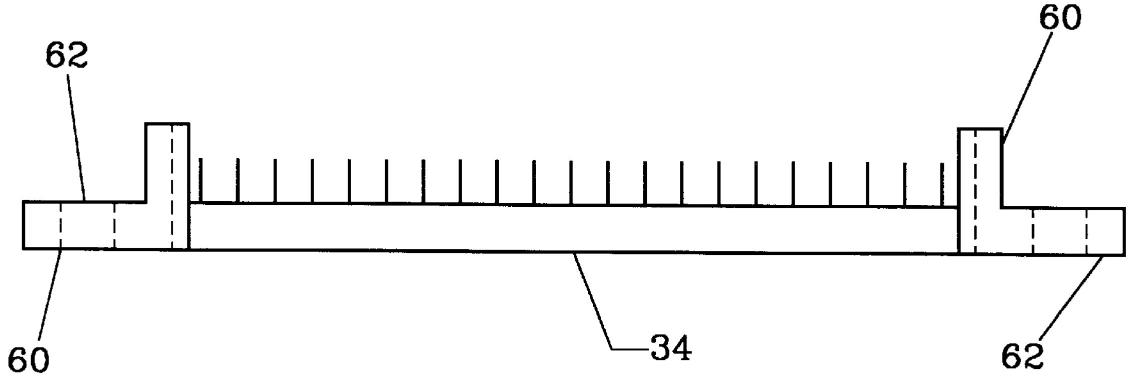
Figure 9:
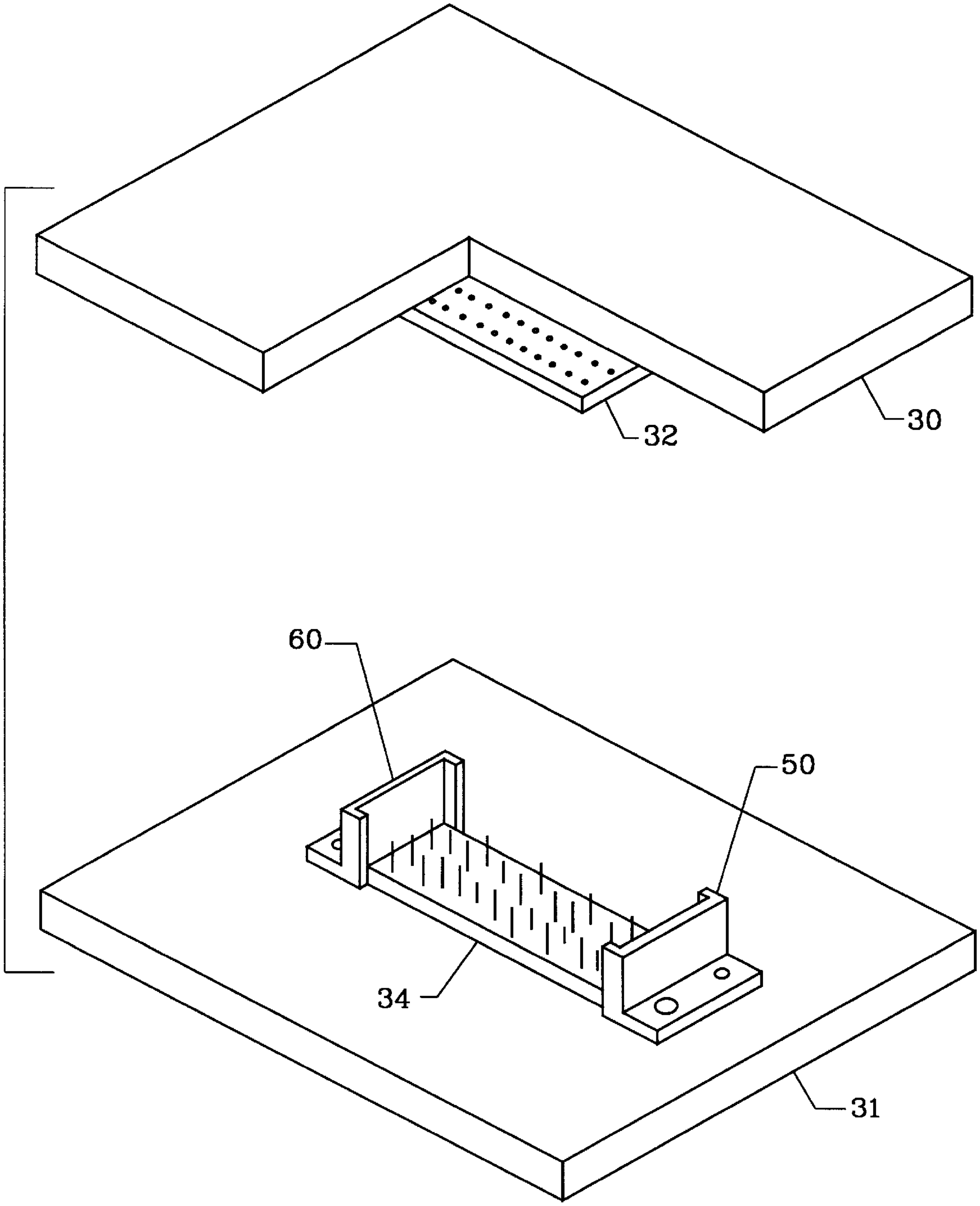
FIG. 9 shows an orthogonal view of the fourth embodiment of electrical connector guide installed on the circuit card assemblies with the male and female electrical connectors.

The final embodiment of the invention is shown in FIGS. 8*a* and 8*b* as well as FIG. 9. As can be seen in FIG. 9, the connector guide 60 runs along the male electronic connector 34 on the two shorter sides and extends slightly with flanges along the long side of the connector. The connector guide can be seen in more detail in FIGS. 6*a* and 6*b*. In this case, the connector is a two piece structure which is mounted at either end of the male electronic connector guide. Each piece is identical in that it has a mounting tab 62 and through each mounting flange is a mounting hole 64 for mounting the connector guide to the circuit card assembly. Also included is threaded hole 66 for receiving the circuit card assembly separator device 40.

In order to establish the electrical connection between the circuit card assemblies, the same process is followed as with the first two embodiments. Both pieces of the connector guide 60 contact opposite edges of the female electrical connector 32. The two circuit card assemblies are then pushed together and the female electrical connector slides within the two pieces of the connector guide the electrical pins then pass into the connector holes and the electrical connection is complete. In order to separate the circuit card assemblies, once again the separator device is threaded into the hole in the flange and as the device is rotated it threads further into the hole and contacts circuit card assembly 30, thus pushing the two cards apart.

Described above are different embodiments of the invention. One skilled in the art would realize that many different modification to the above embodiments could be made without departing from the spirit, scope, and teaching of the invention.

I claim:

1. An apparatus for providing an electrical connection between parallel mounted first and second circuit card assemblies comprising:

a male electrical connector with a plurality of electrical connection pins extending therefrom, wherein said male electrical connector is in mechanical and electrical connection with the first circuit card assembly;

a female electrical connector with a plurality of electrical connection holes for receiving the electrical connection pins, wherein said female electrical connector is in mechanical and electrical connection with the second circuit card assembly; and a connector guide attached to the first circuit card assembly adjacent to the male electrical connector which contacts the female connector during the electrical connection of the male and female connectors and provides a guide for inserting the connector pins into the connector holes, wherein the guide has a threaded hole formed therein which is aligned with a hole through the first circuit card assembly, wherein said hole in the guide and said hole in the first circuit card assembly are configured to receive a threaded tool inserted in both the holes until the tool contacts the second circuit card assembly and pushes the first and second circuit card assemblies apart.

2. The apparatus of claim 1 wherein the guide extends along an entire side of the male connector and also extends along a portion of at least two additional sides of the male electrical connector.

3. The apparatus of claim 2 wherein the connector guide is taller than the connector pins extending from the male electrical connector.

4. The apparatus of claim 1 wherein the guide is comprised of two pieces which are mounted on opposite ends of the male electrical connector and extend along the entire side which the piece is proximate to, as well as an additional portion of two other sides male electrical connector.

5. The apparatus of claim 4 wherein the connector guide is taller than the connector pins extending from the male electrical connector.

6. The apparatus of claim 1 wherein the guide is formed such that it completely surrounds the male electrical connector.

7. The apparatus of claim 6 wherein the connector guide is taller than the connector pins extending from the male electrical connector.

8. The apparatus of claim 6 wherein the guide has a threaded hole formed therein which is aligned with a hole through the first circuit card assembly, a thread tool inserted in both the holes and rotated until the tool contacts the second circuit card assembly and pushes the first and second circuit card assemblies apart.

* * * * *

US006039581C1

(12) EX PARTE REEXAMINATION CERTIFICATE (5084th)

United States Patent (10) Number: US 6,039,581 C1
DiMarco (45) Certificate Issued: Mar. 15, 2005

(54) ELECTRICAL CONNECTOR FOR CIRCUIT CARD ASSEMBLIES

(75) Inventor: Mario DiMarco, Scottsdale, AZ (US)

(73) Assignee: Honeywell Inc., Minneapolis, MN (US)

Reexamination Request:
No. 90/005,894, Dec. 22, 2000

Reexamination Certificate for:
Patent No.: 6,039,581
Issued: Mar. 21, 2000
Appl. No.: 09/000,773
Filed: Dec. 30, 1997

(51) Int. Cl.[7] ................................................ H01R 12/00
(52) U.S. Cl. .......................................... 439/74; 439/923
(58) Field of Search ............................ 439/74, 923, 75, 439/78

(56) References Cited

U.S. PATENT DOCUMENTS 2,953,767 A 9/1960 Jackson et al.
4,993,965 A 2/1991 Eck

FOREIGN PATENT DOCUMENTS

EP 0 427 560 A2 5/1991
EP 0 717 473 A1 6/1996

OTHER PUBLICATIONS

"Self–Alignment Device For Off–The–Shelf Electrical Connectors", IBM Technical Disclosure Bulletin, vol. 33, No. 1A, Jun. 1990, pp. 435–437.

*Primary Examiner*—Jean F. Duverne

(57) ABSTRACT

A connector device provides an electrical connection between parallel mounted circuit card assemblies. On one circuit card assembly a male electrical connector is mounted which has electrical connection pins extending from it. On the other circuit card assembly is female electrical connector which has electrical connection holes which receive the connection pins. Mounted proximate to the male electrical connector is a connector guide which contacts at least two edges of the female electrical connector and guides the connector pins into the connector holes. The connector guide also extends above the connector pins and provides protection for the pins while the circuit card assembly is being handled.

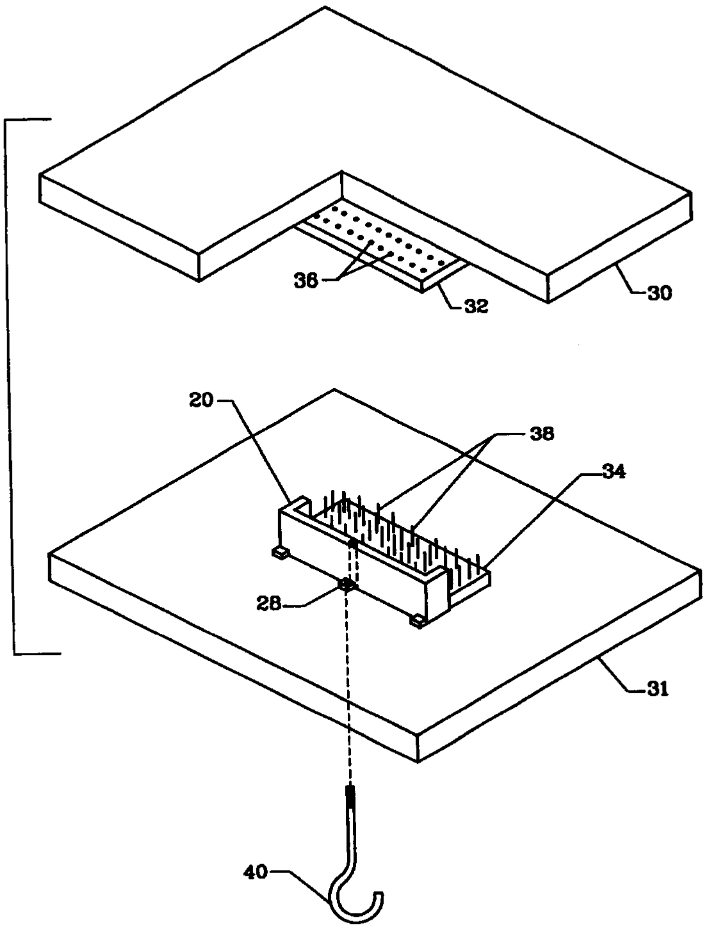

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–3 and 6–8 is confirmed.

Claim 4 is determined to be patentable as amended.

Claim 5, dependent on an amended claim, is determined to be patentable.

4. The apparatus of claim 1 wherein the guide is comprised of two pieces which are mounted on opposite ends of the male electrical connector and extend along the entire side which the piece is proximate to, as well as an additional portion of two other sides *of the* male electrical connector.

* * * * *